United States Patent
Seko

(10) Patent No.: US 6,262,540 B1
(45) Date of Patent: Jul. 17, 2001

(54) SEMICONDUCTOR DEVICE AND IMAGE FORMATION APPARATUS USING SAME

(75) Inventor: Yasuji Seko, Nakai-machi (JP)

(73) Assignee: Fuji Xerox Co., Ltd., Tokyo (JP)

(*) Notice: Subject to any disclaimer, the term of this patent is extended or adjusted under 35 U.S.C. 154(b) by 0 days.

(21) Appl. No.: 09/315,134

(22) Filed: May 20, 1999

(30) Foreign Application Priority Data

May 26, 1998 (JP) .................................................. 10-144801

(51) Int. Cl.[7] .................................................... G09G 3/00
(52) U.S. Cl. .................................... 315/169.1; 315/169.3; 345/55; 345/76
(58) Field of Search ........................... 315/169.1, 169.3, 315/169.4; 345/55, 206, 214, 76, 77, 82, 84

(56) References Cited

U.S. PATENT DOCUMENTS

| | | | |
|---|---|---|---|
| 3,479,517 | * 11/1969 | Bray et al. | 250/213 |
| 4,456,909 | * 6/1984 | Takahara et al. | 315/169.3 |
| 4,888,523 | * 12/1989 | Shoji et al. | 315/169.3 |
| 5,283,447 | 2/1994 | Olbright et al. | 257/85 |
| 5,552,677 | * 9/1996 | Pagones | 315/169.1 |
| 5,793,163 | * 8/1998 | Okuda | 315/169.3 |
| 5,828,181 | * 10/1998 | Okuda | 345/76 |
| 5,844,368 | * 12/1998 | Okuda et al. | 315/169.3 |

FOREIGN PATENT DOCUMENTS

| | | |
|---|---|---|
| 61-31271 | 2/1986 | (JP). |
| 7-503104 | 3/1995 | (JP). |

* cited by examiner

*Primary Examiner*—Don Wong
*Assistant Examiner*—Thuy Vinh Tran
(74) *Attorney, Agent, or Firm*—Oliff & Berridge, PLC

(57) ABSTRACT

A semiconductor device includes a light-emitting element array including plural light-emitting elements and being formed on a semiconductor substrate, a switching element array formed on the semiconductor substrate monolithically with the light-emitting element array, and including switching elements laid out in a matrix form and each having an input end, an output end and a control end with one of the input end and the output end being connected to any one of the plural light-emitting elements, first connection means for connecting the control end of each of the plural switching elements disposed in the same column or the other of the input end and the output end thereof to a first external connection end different per the same column, and second connection means for connecting the control end of each of the plurality of switching elements disposed in the same column or one side of the other of the input end and the output end thereof not being connected to the first external connection end to a second external connection end different per the same row.

15 Claims, 11 Drawing Sheets

SEMICONDUCTOR DEVICE AND IMAGE FORMATION APPARATUS USING SAME

BACKGROUND OF THE INVENTION

1. Field of the Invention

The present invention relates generally to semiconductor devices and image forming apparatus, and more particularly to a semiconductor device having a light-emitting element array adaptable for use as a light source in electronic equipment including but not limited to laser printers and laser display units plus optical communications systems as well as optical signal processing apparatus, along with an image formation apparatus using the semiconductor device.

2. Description of the Related Art

In image formation equipment such as laser printers or the like, in the case where a light-emitting element array with a plurality of light-emitting elements is employed as the light source for producing light according to respective pixels of an image to be formed, it is required that each light-emitting element be driven in a way independent of others; to this end, one typical prior known approach is to provide lead wires for electrically feeding respective light-emitting elements (referred to as "individual leads" hereinafter) on a one-per-element basis. Accordingly, in the case of a light-emitting element array constituted from n rows and m columns of light-emitting elements, i.e. n×m light-emitting elements, a great number of connection leads as many as n×m lines are required resulting in creation of a problem as to an increase in production cost while making it difficult to achieve higher integration density of light-emitting elements.

One approach to avoiding this problem has been described in Published Unexamined Japanese Patent Application ("PUJPA") No. 61-31271, which teaches the use of a technique for employing an LED array light source to form a hard copy or "print" image of high density. As shown in FIG. 11, the LED array 29 is made up of LED elements laid out two-dimensionally which are associated with a mesh-like or "matrix" pattern of rows of parallel leads (referred to as "cathode leads" hereinafter) 3 and columns of leads ("anode leads") 4. These cathode leads 3 and anode leads 4 have certain terminate ends at which wire bonding pads 33 and 32 are provided for use in individually driving the LED elements.

Another related art technique is found in PUJPA No. 7-503104 ("JP-A-7-503104"), which suggests use of a lamination of vertical-cavity surface-emitting laser structures with a transistor structure to thereby form a matrix lead pattern associated with respective transistor elements in the transistor structure. Driving a given transistor element permits light production at a corresponding vertical-cavity surface-emitting laser element that is placed on the upper side or the lower side of the transistor being presently driven.

The related art techniques set forth in the Japanese documents JP-A-61-31271 and JP-A-7-503104 require the use of a reduced number (n+m) in total of leads for the light-emitting element array of a 2D matrix of n rows and m columns of light-emitting elements; thus, it becomes possible to greatly reduce the required number of connection leads when compared to the case of the individual lead connection stated above. As a single wire bonding is formed per lead for example, a decrease in number of connection leads would lead to a decrease in number of wire bonding and also to a decrease in channel number of driver circuitry for use in driving the light-emitting element array. This in turn makes it possible to reduce production costs of the entire of equipment that employs this light-emitting element array, and also to achieve high integration density of such light-emitting element array.

Unfortunately, the related art approaches as taught by the Japanese documents JP-A-61-31271 and JP-A-7-503104 cited above are encountered with a problem which follows. In case the light-emitting elements constituting the light-emitting element array are further increased in number and disposed with higher integration density while narrowing the interval between rows of light-emitting elements and/or between columns thereof, the layout pitch of such leads (anode leads and cathode leads) becomes narrower resulting in incapability of implementation of the intended wire bonding, which in turn makes it impossible to achieve electrical interconnection required. In other words, the minimum lead pitch enabling wire bonding or else limits the row distance and column distance of those light-emitting elements making up a light-emitting element array. This will be explained more practically below.

In currently available wire-bonding techniques the minimum allowable pitch is 80 $\mu$m, or more or less. Suppose that wire-bonding pads are arrayed in a staggered or "zigzag" pattern in which pads are arrayed in two parallel lines with each pad in one line opposing a midway between adjacent one of the pads forming the other line. If this is the case, even where the minimum pitch of wire-bonding pads in each line is set at approximately 80 $\mu$m, the minimum lead pitch can be reduced down to about 40 $\mu$m, which is half of the minimum pad pitch. However, even in this case, the minimum lead pitch stays as large as about 40 $\mu$m.

Alternatively, imagine that the required number of connection leads is relatively less. In this case, expanding those portions of leads near the wire bonding pads into a sector shape might enable enlargement of the wire-bonding pad pitch. However, if the required number of such leads increases beyond several hundreds, then this pad pitch enlargement approach will no longer work well. This can be said because an increase in pitch of wire-bonding pads would result in an excessive increase in size of a substrate used. In view of this, the minimum layout pitch of those light-emitting elements constituting a light-emitting element array of relatively high density has been typically limited to 40 mm, or more or less.

It has been discussed that the related art approaches stated above suffer from a problem that a light-emitting element array having multiple light-emitting elements is strictly required to set the pitch of its leads at a limited value that permits electrical connection by wire bonding or the like, which hardly allows the pitch to decrease below a prespecified value of several tens of $\mu$m. This is a serious bar to reduction of the row distance and column distance of respective light-emitting elements, which in turn makes it impossible, or at least greatly difficult, to manufacture the intended light-emitting element array with high integration density required.

SUMMARY OF THE INVENTION

The present invention has been made in order to avoid the problem above, and its objective is to provide a semiconductor device capable of forming a light-emitting element array with high integration density, along with an image formation apparatus using the semiconductor device.

To attain the foregoing object, a semiconductor device according to this invention comprises: a light-emitting element array including a plurality of light-emitting elements and being formed on a semiconductor substrate; a switching element array formed on said semiconductor substrate monolithically with said light-emitting element array, and including switching elements laid out in a matrix form and each having an input end, an output end and a control end with one of said input end and said output end connected to any one of said plurality of light-emitting elements; first connection means for connecting the control end of each of the plurality of switching elements disposed in the same column or the other of the input end and the output end thereof to a first external connection end different per said same column; and second connection means for connecting the control end of each of the plurality of switching elements disposed in the same column or one side of the other of the input end and the output end thereof not being connected to said first external connection end to a second external connection end different per said same row According to the semiconductor device of the invention, switching elements each having an input end and an output end plus a control end are laid out in a matrix form, wherein one of the input end and output end of a switching element is connected to any one of a plurality of light-emitting elements as provided in the light-emitting element array. Here, the switching element array with the matrix of switching elements is formed on a semiconductor substrate in a monolithic fashion with the light-emitting element array.

It should be noted that the switching elements may be bipolar transistors, field effect transistors, or any other similar suitable active elements. Also note that the control end is for control of turn-on/off between the input end and output end of a switching element. As an example, in case the switching element is a bipolar transistor, the control end corresponds to the base electrode of it. If the switch element is a field effect transistor then the control end is the gate thereof.

In addition, respective control ends of those switching elements disposed in the same column or the other of the input ends and output ends thereof are connected by a first connection means to first external connection ends in different columns, whist respective control ends of plural switching elements disposed in the same row or certain sides whereat the other of the input ends and output ends thereof are not connected to the first external connection ends are connected by a second connection means to second external connection ends at different rows. Note that the first external connection ends and second external connection ends are electrodes used for connection with external circuitry, which may correspond to wire-bonding pads or the like.

With the semiconductor device thus arranged, it becomes possible by external turn-on/off control of the switching elements connected to the light-emitting elements to control power supply to such light-emitting elements.

In this way, according to the semiconductor device of the invention, since the external connection ends used for connection with the outside are provided with respect to the switching element array having a matrix of switching elements for controlling driving of respective light-emitting elements as provided in the light-emitting element array, it is possible to narrow the layout pitch of the light-emitting element array, which in turn makes it possible to fabricate the light-emitting element array with increased integration density.

In addition, the semiconductor device of the invention is such that the plurality of light-emitting elements included in said light-emitting element array are disposed in a matrix form and connected by matrix leads, wherein either a row lead or a column lead of said matrix leads is connected to one of the input ends and output ends of said switching elements.

In this way, according to the semiconductor of the invention, a plurality of light-emitting elements provided in the light-emitting element array are laid out in a matrix form and are connected by a mesh-like pattern of "matrix" leads with either row leads or column leads of this matrix leads being connected to one of the input end and output end of each of the switching elements associated therewith. Thus, it is possible to fabricate the light-emitting element array with high integration density as compared to cases where the light-emitting elements are not laid out in a matrix form.

The semiconductor device of the invention is such that said light-emitting elements in the semiconductor device are vertical-cavity surface-emitting lasers elements.

Consequently, according to the semiconductor device of the invention, similar effects and advantages are obtainable as above. Simultaneously, as the light-emitting elements are comprised of vertical-cavity surface-emitting laser elements, it is possible to facilitate fabrication of the light-emitting element array while reducing complexity as compared with the case where edge-emitting light-emitting elements are employed as light-emitting element.

It is noted that as in the semiconductor device of the invention, the multilayer structure of said light-emitting element array on said semiconductor substrate in the semiconductor device is formed in a direction perpendicular to lamination surfaces of the multilayer structure of said light-emitting element array; or alternatively, it may be formed in a direction lying parallel thereto where necessary.

DESCRIPTION OF THE PREFERRED EMBODIMENTS

Figure 1:
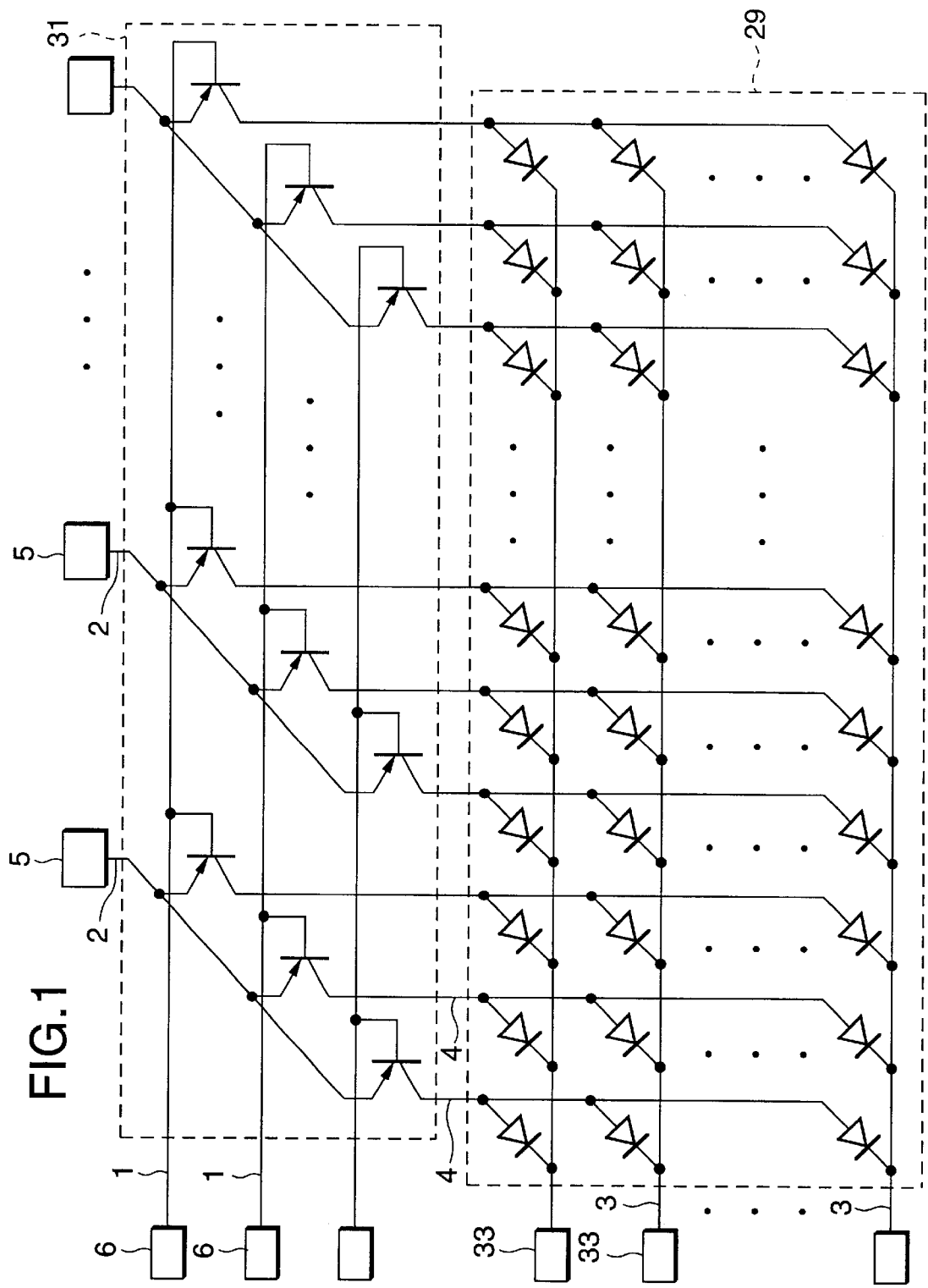
FIG. 1 is a diagram schematically showing one exemplary layout of a light-emitting element array and a transistor array of the present invention along with electrical leads associated therewith.

The semiconductor device in accordance with the present invention is practically arranged as shown in FIG. 1.

More specifically, a transistor array 31 including a plurality of transistor elements for use as switching elements for controlling the flow of current in leads (cathode leads 3 and anode leads 4) of a light-emitting element array 29 having a plurality of light-emitting elements is monolithically formed on the substrate of a light-emitting element array 29. This transistor array 31 is tied to the anode leads 4 of the light-emitting element array 29 while the transistor elements are laid out two-dimensionally. The transistor array 31 is driven by use of a mesh-like pattern of leads—say, matrix leads—with a lead formed at the emitter and base, or collector and base, of each transistor element. Such matrix leads are connected to external driver circuitry via electrical connector means including wire bonding or the like as formed at wire bonding pads 5 and 6.

With such means used, the layout pitch of the wire bonding or else depends only upon the lead pitch of the transistor elements provided in the transistor array, rather than upon the lead pitch of those light-emitting elements in the light-emitting element array. This makes it possible to enlarge the pitch of the wire bonding pads so that it is several times, or sometimes by one order of magnitude, greater than the layout pitch of light-emitting elements. It is thus possible to reduce the layout pitch of light-emitting elements by one and sometimes two orders of magnitude over the prior art, which in turn enables fabrication of highly integrated light-emitting elements.

Additionally, the image formation apparatus set forth in claim 6 is the one that employs as its light source the semiconductor device recited in claims 1 to 5.

In this way, according to the image formation apparatus set forth in claim 6, use of the semiconductor device with the light-emitting element array of high integration density as recited in claims 1 to 5 makes it possible to readily form high-density picture images.

Some preferred embodiments of the present invention will be explained in detail with reference to the accompanying drawings below.

First Embodiment

In a first embodiment, there will be explained a certain case where vertical-cavity surface-emitting laser elements are used as light-emitting elements while pnp transistors are used as switching elements to be monolithically fabricated.

Figure 2:
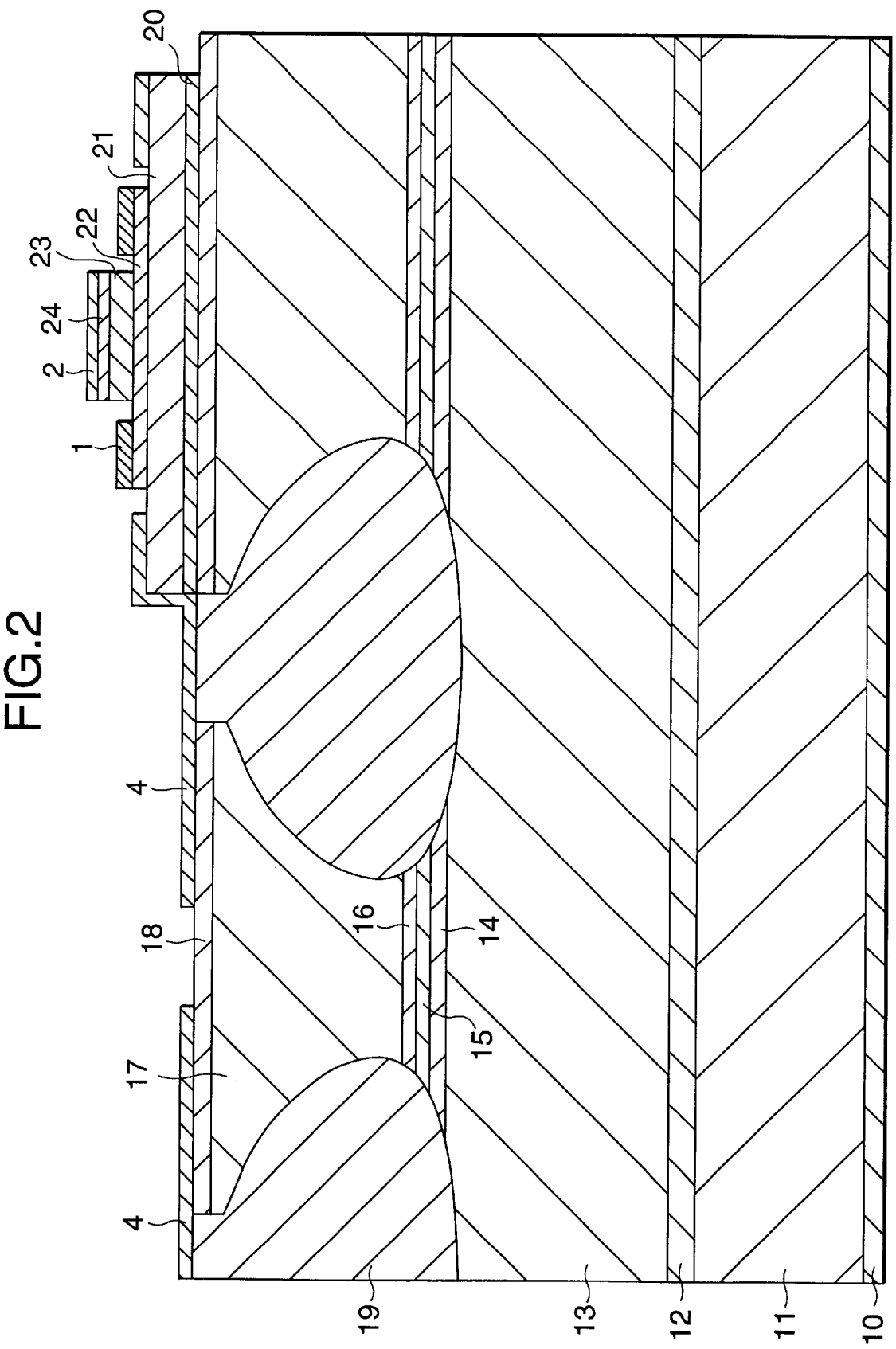
FIG. 2 is a diagram showing in cross-section a structure of a semiconductor device in accordance with a first embodiment.

Crystal growth of an vertical-cavity surface-emitting laser structure layer was performed by metal organic chemical vapor deposition (MOCVD) methods using MOCVD equipment. A resultant multilayer structure is shown in FIG. 2. A manufacturing process of a semiconductor device in accordance with the first embodiment will be explained with reference to this drawing below.

Sequentially grown on a conductive Si-doped n-type GaAs substrate 11 are an n-type GaAs buffer layer 12 (0.2 $\mu$m thick, carrier concentration of $2\times10^{18}/cm^3$), n-type $Al_{0.3}Ga_{0.7}As/Al_{0.9}Ga_{0.1}As$ multilayer film mirror 13 (57.6 nm/64.5 nm×40.5 periods, with the layout of $Al_{0.3}Ga_{0.7}As$ upper side/$Al_{0.9}Ga_{0.1}As$ lower sides, carrier concentration of $2\times10^{18}/cm^3$), $Al_{0.6}Ga_{0.4}As$ spacer layer 14 (89.8 nm thick, non-dope), active region 15 made of $Al_{0.11}Ga_{0.89}As/$ $Al_{0.3}Ga_{0.7}As$ (quantum well layer/barrier layer, thickness of 8 nm/5 nm×4 periods, nondope), $Al_{0.6}Ga_{0.4}As$ spacer layer 16 (89.8 nm thick, nondope), p-type $Al_{0.3}Ga_{0.7}As/Al_{0.9}Ga_{0.1}As$ multilayer film mirror 17 (thickness of 64.5 nm/57.6 nm×30 periods, carrier density of $2\times10^{18}/cm^3$), and p-type contact layer 18 (9 nm thick, carrier density of $1\times10^{19}/cm^3$). Here, a multilayer interface of the multilayer film mirrors 13 and 17 is a graded layer with its composition changed gradually for reduction of electrical resistivity.

A thickness t of each layer of the multilayer film mirrors 13 and 17 is so set as to satisfy $t_i=\lambda/(4\cdot n_i)$ (where $n_i$ is the refractive index of each layer) for light of laser wavelength $\lambda$ (780 nm in this embodiment) to thereby attain high refractivity at the multilayer film mirror as a whole. In addition, each layer of the spacer layers 14 and 16 and the active region 15 is designed so that the total sum of those values of the film thickness $t_i$ of each layer multiplied by refractive index $n_i$—i.e. $t_i \times n_i$—is equal to the laser wavelength $\lambda$, thereby playing a role as a laser oscillator.

Next, unload this substrate from the MOCVD equipment for deposition of a $SiO_2$ film by plasma CVD methods to a thickness of 0.2 mm. This is then etched by photolithography to effect patterning thereby permitting selective exposure of only selected locations of the p-type contact layer 18 in each of which the crystal layer of a transistor will be grown. Such exposed part is of square planar shape (20 mm long per side in this embodiment); as in the layout of a transistor array 31 shown in FIG. 3, three rows and 333 columns of transistors are laid out on the lateral side of an vertical-cavity surface-emitting laser array 30. Additionally, the layout of the laser array 30 is fabricated through proton injection and electrode formation processes as will be described later.

Next, this substrate is again put in the MOCVD apparatus: first grow an n-type GaAs layer 20 (100 nm thick, carrier concentration of $1\times10^{17}/cm^3$) for use in stopping current flow; then, grow thereon ap-type GaAs collector layer 21 (300 nm thick, carrier concentration of $1\times10^{17}/cm^3$), n-type GaAs base layer 22 (100 nm thick, carrier density of $4\times10^{18}/cm^3$), and p-type $Al_{0.3}Ga_{0.7}As$ emitter layer 23 (200 nm thick, carrier density of $5\times10^{17}/cm^3$), which constitute a transistor(s); finally, grow a p-type GaAs contact layer 24 (200 nm thick, carrier density of $5\times10^{18}/cm^3$) for use in making ohmic contact with electrodes.

As no crystals grow on the $SiO_2$ film, the transistor structure layer will be formed only on or over those portions from which the $SiO_2$ film was removed away, i.e. portions of p-type contact layer 18 being exposed to the surface. With this multilayer structure, since the n-type GaAs layer 20 and p-type contact layer 18 plus p-type multilayer film mirror 17 underlie the p-type GaAs collector layer 21, this portion becomes a pnp structure in which no currents flow in the vertical direction (the up/down direction in FIG. 2). Accordingly, no currents flow in the p-type contact layer 18 and multilayer film mirror 17 underlying a transistor element to ensure that only the transistor element operates properly.

Next, let the base layer 22 and collector layer 21 of the transistor structure layer be exposed by etching to the surface as shown in FIG. 2.

Figure 3:
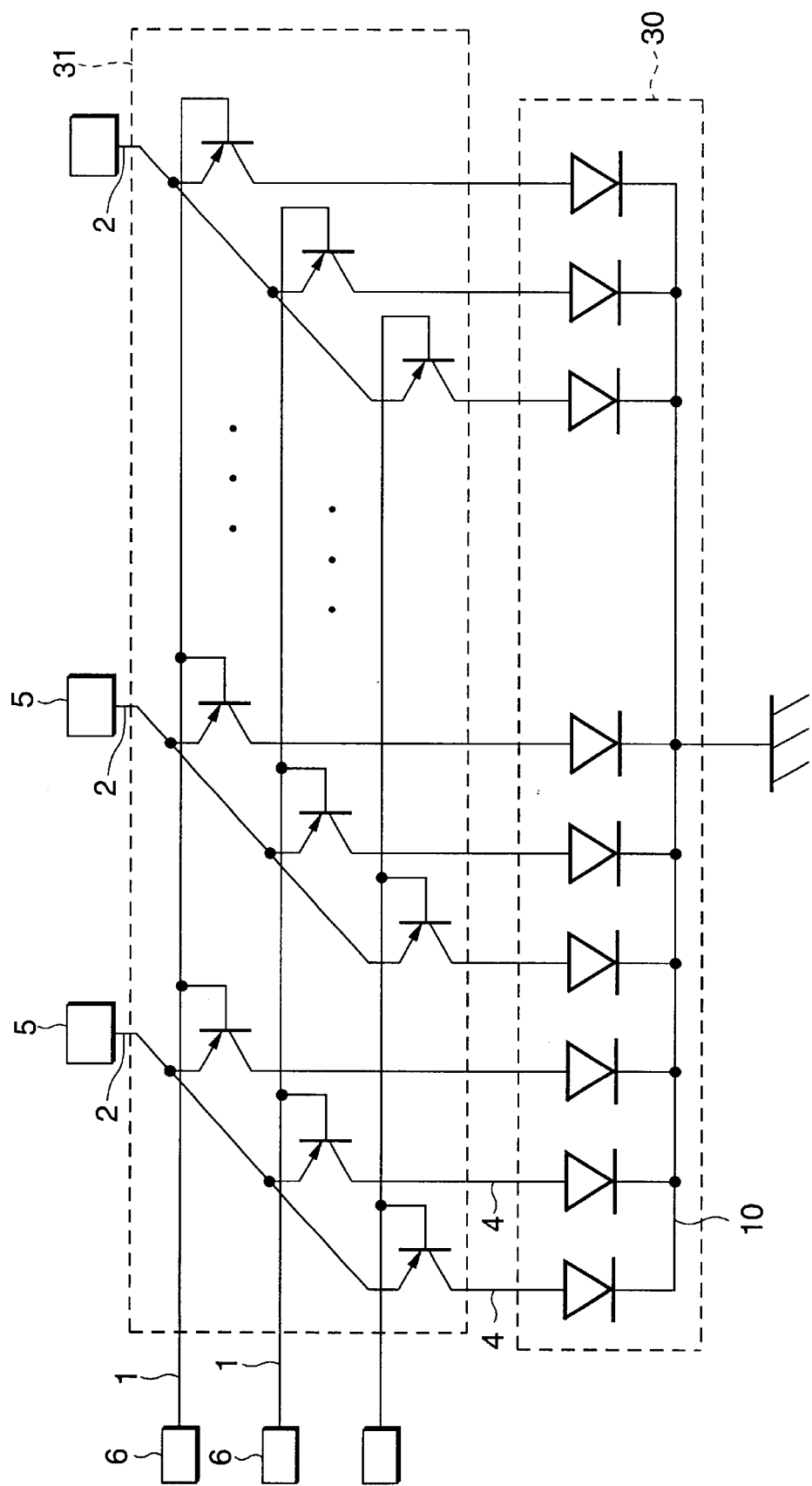
FIG. 3 is a schematical circuit diagram showing the layout and electrical interconnection of a light-emitting element array and transistor array used in the semiconductor device in accordance with the first embodiment.

Next, in order to manufacture vertical-cavity surface-emitting laser elements, a current narrowing/blocking structure is formed. In this embodiment, a method was employed which includes the step of forming, by irradiation of proton (H⁻) with an acceleration voltage varied, a proton-doped region 19 that covers from the crystal surface down to the depth of 3 to 4 $\mu$m to thereby form a dielectric region in which current hardly flows. The size of an active region permitting flow of current is approximately Φ6 μm in diameter, which is formed in the horizontal direction (lateral direction in FIG. 2) of the active region of an vertical-cavity surface-emitting laser element. As shown in FIG. 3, the vertical-cavity surface-emitting laser array 30 is such that 999 vertical-cavity surface-emitting laser elements are linearly arrayed at a pitch of 30 μm between adjacent ones of them.

Next, form electrodes for the vertical-cavity surface-emitting laser elements and transistor elements; then, rail leads for interconnection between them. For the p-type contact layer 18 of an vertical-cavity surface-emitting laser element and the p-type contact layer 24 and p-type collector layer 21 of a transistor element, fabricate p-type electrodes of an AuZn-alloy; an n-type electrode of an AuGe-alloy was formed at the n-type base layer 22 of the transistor element. These materials are deposited by evaporation method to a thickness of 300 nm, and are then patterned into a desired shape by photolithograhy.

Next, leads (referred to as "anode leads" hereinafter) 4 were formed for electrical connection between the electrodes of p-type contact layers 18 of vertical-cavity surface-emitting laser elements and electrodes of p-type collector layers 21 of transistor elements. In addition, an AuGe-alloy 10 was formed as an n-type common electrode of the vertical-cavity surface-emitting laser array 30 on the entire bottom surface of the n-type GaAs substrate 11. Note that this electrode is coupled to ground.

Next, as the leads for use in driving the transistor elements, rows of parallel leads (referred to hereinafter as "base leads")

1 are formed at the electrodes of n-type base layers 22 of transistor elements; columns of parallel leads (referred to hereafter as "emitter leads")

2 are formed at the electrodes of p-type contact layers 24 of the transistor elements. Wire bonding pads 5 and 6 are formed at the emitter leads 2 and base leads 1 in a manner such that a pad 5 or 6 is at a "free" terminate end of each of the emitter leads 2 and base leads 1 which is not connected to any transistor element.

Figure 4:
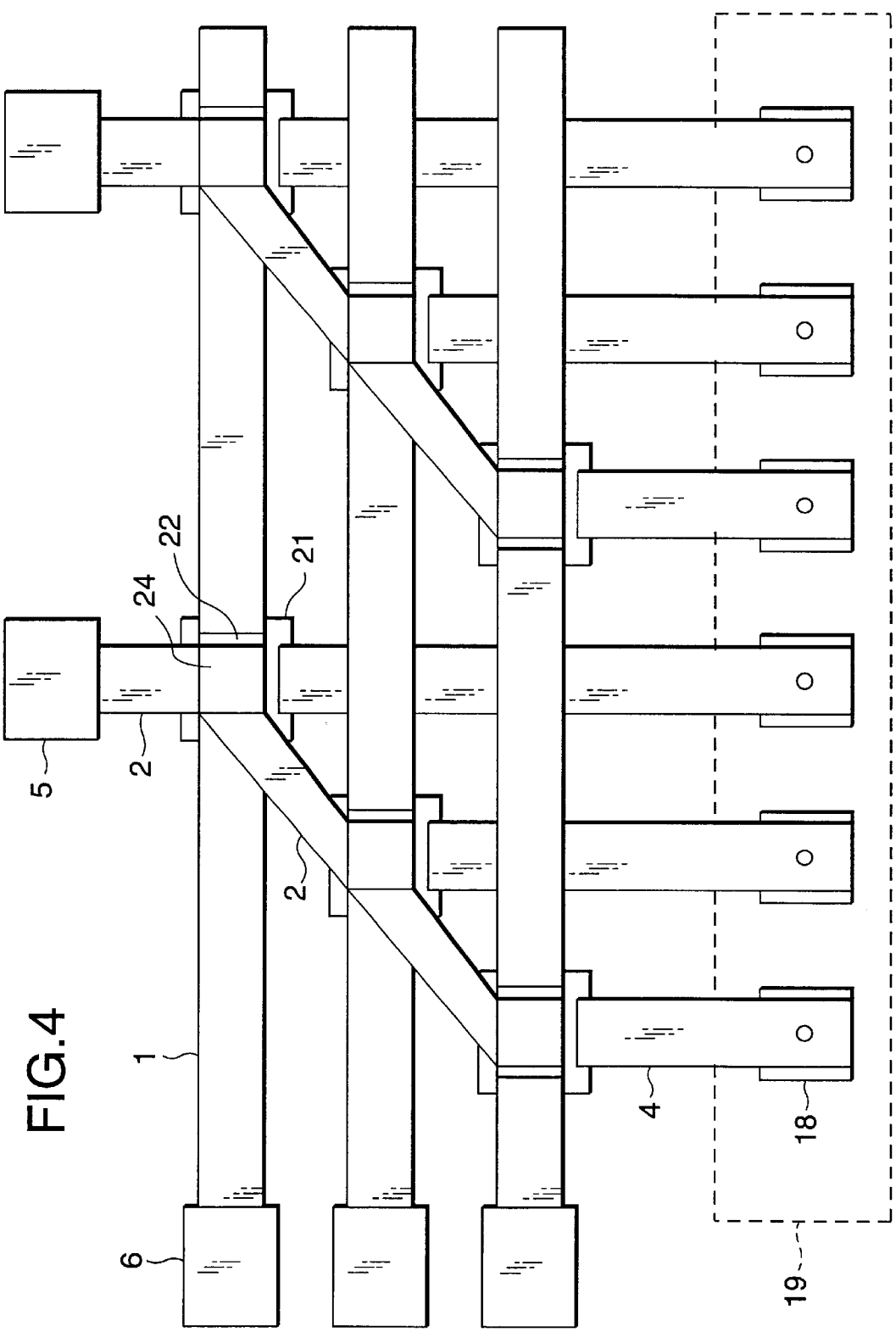
FIG. 4 is a schematical plan view showing an electrical lead pattern of the semiconductor device in accordance with the first embodiment.

A relative positional relationship (plan view) of the base leads 1 and emitter leads 2 as well as anode leads 4 versus respective components associated therewith is shown in FIG. 4. As shown herein, the electrodes of p-type contact layers 18 of vertical-cavity surface-emitting laser elements and the electrodes of the p-type collector layers 21 of the transistor elements are connected by the anode leads 4; electrodes of n-type base layers 22 of those transistor elements disposed in the same row and a bonding pad 6 are connected by abase lead 1; electrodes of p-type contact layer 24 of those transistor elements disposed in the same column and a wire bonding pad 5 are connected by an emitter lead 2.

As previously stated, 999 vertical-cavity surface-emitting laser elements in the vertical-cavity surface-emitting laser array 30 are one-dimensionally laid out at a layout pitch of about 30 μm. Regarding the transistor array 31, its transistor elements are laid out in a matrix form of 3 rows by 333 columns; hence, the layout pitch of the wire bonding pads 5 formed at the ends of the emitter leads 2 becomes about 90 μm (=approx. 30 mm×3). Note that in this embodiment, the layout pitch of the wire bonding pads 6 formed at the ends of the base leads 1 was set at about 100 μm.

It should be noted that the vertical-cavity surface-emitting laser array 30 corresponds to the light-emitting element array of the present invention; the transistor array 31 corresponds to the switching element array of this invention; the emitter leads 2 to the first connection means of the invention; the base leads 1 to the second connection means thereof; the wire bonding pads 5 to the first external connection ends thereof; the wire bonding pads 6 to the second external connection ends of the invention.

It has been affirmed that wire bonding is done with respect to these wire bonding pads 5 and 6 for connection with external drive circuitry (not shown) to permit the drive circuit to apply drive voltages to the wire bonding pads 5 and 6 rendering each transistor element operative, which enables successful driving of the vertical-cavity surface-emitting laser array 30.

Second Embodiment

In a second embodiment, there will be explained a case where the anode leads and cathode leads of an vertical-cavity surface-emitting laser array are formed into a matrix form, wherein each of these anode leads and cathode leads is driven by a transistor array. In other words, although the first embodiment is designed employing the vertical-cavity surface-emitting laser array of one-dimensional (1D) layout, the second embodiment is arranged to use an vertical-cavity surface-emitting laser array with two-dimensional (2D) layout. First of all, a manufacturing process of a semiconductor device in accordance with the second embodiment will be explained with reference to FIG. 5 below.

As shown in the drawing, MOCVD apparatus is used to sequentially grow on a semi-insulative GaAs substrate 51 an n-type GaAs buffer layer 12 (0.2 μm thick, carrier concentration of $2 \times 10^{18}/cm^3$), n-type $Al_{0.3}Ga_{0.7}As/Al_{0.9}Ga_{0.1}As$ multilayer film mirror 13 (thickness of 57.6 nm/64.5 nm×40.5 periods, with the layout of $Al_{0.3}Ga_{0.7}As$ upper side/$Al_{0.9}Ga_{0.1}As$ lower side, carrier concentration of $2 \times 10^{18}/cm^3$), $Al_{0.6}Ga_{0.4}As$ spacer layer 14 (89.8 nm thick, non-dope), active region 15 made of $Al_{0.11}Ga_{0.89}As/Al_{0.3}Ga_{0.7}As$ (quantum well layer/barrier layer, thickness of 8 nm/5 nm×4 periods, nondope), $Al_{0.6}Ga_{0.4}As$ spacer layer 16 (89.8 nm thick, nondope), and a p-type $Al_{0.98}Ga_{0.02}As$ layer 60 (65.4 nm thick, carrier density of $2 \times 10^{18/cm3}$); further, sequentially grow thereon a p-type $Al_{0.9}Ga_{0.1}As/Al_{0.3}Ga_{0.7}As$ multilayer film mirror 17 (thickness of 64.5 nm/57.6 nm×29.5 periods, carrier density of $2 \times 10^{18}/cm^3$), and a p-type contact layer 18 (9 nm thick, carrier density of $1 \times 10^{19}/cm^3$). Here, the multilayer interface of the multilayer film mirrors 13 and 17 is a graded layer changed gradually in composition for reduction of electrical resistivity.

Next, unload this substrate away from the MOCVD apparatus for deposition of a $SiO_2$ film by plasma CVD to a thickness of 0.2 μm. This is then etched by photolithography to effect patterning thus permitting selective exposure of only certain locations of the p-type contact layer 18 in which crystal layers of transistors will be grown. Such exposure portions are each of square planar shape (20 μm long per side in this embodiment), wherein as in the layout of transistor arrays 31 and 70 shown in FIG. 6, three rows and 333 columns of transistors are laid out on each of the upper and lower sides of an vertical-cavity surface-emitting laser array 75 to be described later.

Next, this substrate is again put in the MOCVD apparatus to grow a p-type GaAs collector layer 21 (300 nm thick, carrier concentration of $1 \times 10^{17}/cm^3$), n-type GaAs base layer 22 (100 nm thick, carrier density of $4 \times 10^{18}/cm^3$), and p-type $Al_{0.3}Ga_{0.7}As$ emitter layer 23 (200 nm thick, carrier density of $5 \times 10^{17}/cm^3$), which constitute a transistor; finally, grow a p-type GaAs contact layer 24 (200 nm thick, carrier density of $5 \times 10^{18}/cm^3$) for use in making ohmic contact with electrodes.

As no crystals grow on the $SiO_2$ film, a pnp transistor structure layer is formed only on the p-type contact layer 18 being exposed to the surface.

Figure 5:
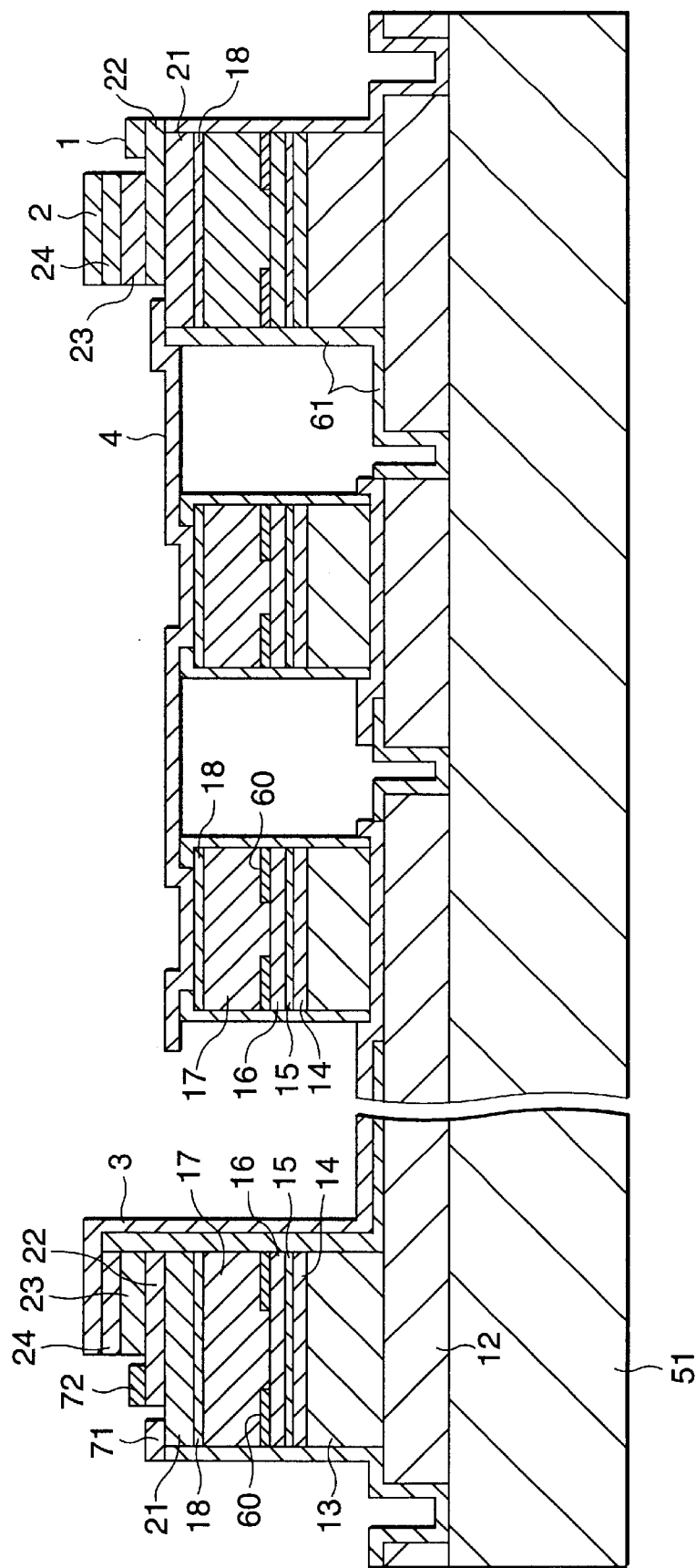
FIG. 5 is a sectional diagram showing a structure of a semiconductor device in accordance with a second embodiment.

Next, remove the $SiO_2$ film on the entire surface; then, etching shown in FIG. 5 was carried out in order to form a post structure (Φ20 μm in diameter) of an vertical-cavity surface-emitting laser element and also to establish electrical isolation of transistor elements. In order to fabricate the current narrowing/blocking structure of this vertical-cavity surface-emitting laser element, an $Al_{0.98}Ga_{0.02}As$ layer 60 was selectively oxidized. For the oxidation method in this case, a method was employed which includes the steps of inserting a sample into thermal processing furnace in vapor environment, and heating it up to 400° C. Due to this thermal processing, the $Al_{0.98}Ga_{0.02}As$ layer 60 as exposed on the surface will be oxidized in a concentric circular shape from the periphery. An oxide layer of $Al_2O_3$ is formed with a hole (5 μmΦ in diameter) left for a region that permits flow of current, thereby to form the current blocking structure.

Next, expose by etching the base layer 22 and collector layer 21 of the transistor structure layer to the surface as shown in FIG. 5.

Next, form electrodes at vertical-cavity surface-emitting laser elements and transistor elements; then, rail leads for interconnection therebetween. An AuZn alloy was used as p-type electrodes of the vertical-cavity surface-emitting laser elements and transistor elements while using an AuGe alloy as n-type electrodes. These materials are deposited by evaporation methods to a thickness of 300 nm, and then patterned by photolithography into a desired shape; then, rail necessary leads thereon. In addition, a dielectric layer such as a $SiN_x$ layer 61 or the like is formed on sidewalls of the post structure of an vertical-cavity surface-emitting laser element and also at crossover sections of leads for electrical separation between adjacent ones of them.

As such leads, there were formed leads (referred to as "anode leads" hereinafter) 4 for electrical connection between p-type contact layers 18 of vertical-cavity surface-emitting laser elements and p-type collector layers 21 of transistor array 31 on the upper side of FIG. 6, along with leads (referred to hereinafter as "cathode leads") 3 for electrical connection between n-type buffer layers 12 of vertical-cavity surface-emitting laser elements and p-type emitter layers 23 of a transistor array 70 on the lower side of FIG. 6.

Additionally, as the leads for use in driving the transistor array 31 on the upper side of FIG. 6, fabricate rows of parallel leads (referred to as "base leads" hereinafter) 1 with respect to n-type base layers 22 of transistor elements, and also form columns of leads (referred to as "emitter leads" hereinafter) 2 for contact layers 24 of p-type emitter layers 23 of the transistor elements. Wire bonding pads 5 and 6 are formed respectively at specified terminate ends of both of these emitter leads 2 and base leads 1, which ends are connected to no transistor elements (see FIG. 6, as not shown in FIG. 5).

In addition, as the leads used for driving the transistor array 70 on the lower side of FIG. 6, fabricate rows of parallel leads (referred to as "base leads" hereinafter) 72 with respect to n-type base layers 22 of transistor elements while forming columns of leads (referred to as "collector leads" hereafter) 71 for p-type collector layers 21 of such transistors. Wire bonding pads 73 and 74 are formed respectively at those terminate ends of both of these collector leads 71 and base leads 72, which ends are connected to no transistor elements (see FIG. 6 as not depicted in FIG. 5).

Figure 6:
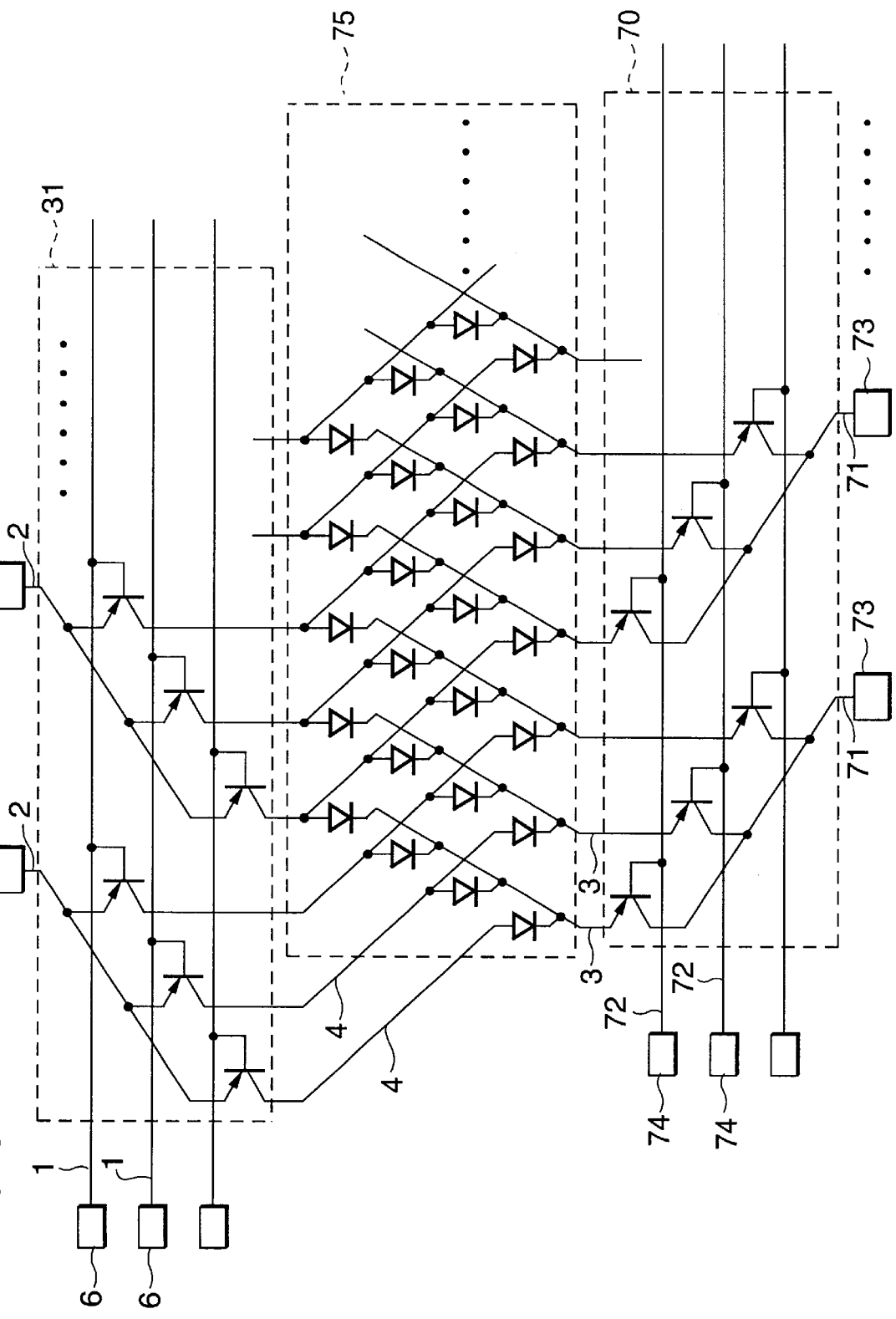
FIG. 6 is a schematical circuit diagram showing the layout and electrical lead connection of a light-emitting element array and transistor array in the semiconductor device in accordance with the second embodiment.

As shown in FIG. 6, the vertical-cavity surface-emitting laser elements making up the vertical-cavity surface-emitting laser array 75 are laid out in a matrix form of four rows and 100 columns with its column direction being defined as a slant or "diagonal" direction, wherein the layout pitch of each vertical-cavity surface-emitting laser element in this embodiment is set at 42 mm in the row direction (horizontal direction) and at 100 mm in the column direction (vertical direction).

The transistor elements constituting the transistor array 31 are arrayed into a matrix of three rows by 103 columns; the transistor elements making up the transistor array 70 are in a matrix of three rows by 100 columns. The layout pitch of the wire bonding pads 5 as provided for the emitter leads 2 was set at 126 μm, whist the layout pitch of the wire bonding pads 6 provided at the base leads 1 was 100 μm. Similarly, the layout pitch of the wire bonding pads 73 provided for the collector leads 71 was 126 μm whereas the layout pitch of the wire bonding pads 74 provided for the base leads 72 was 100 μm.

It is noted that the vertical-cavity surface-emitting laser array 75 corresponds to the light-emitting element array of the present invention; the transistor arrays 31 and 70 correspond to the switching element array of the instant invention; the emitter leads 2 and collector leads 7 correspond to the first connection means of this invention; the base leads 1 and 72 to the second connection means of the invention; the wire bonding pads 5 and 73 to the first external connection ends thereof; the wire bonding pads 6 and 74 to the second external connection ends of the invention.

It has been affirmed that wire bonding is done with respect to the wire bonding pads 5 and 6 along with the wire bonding pads 73 and 74 for connection with external driver circuitry, not shown, to permit the drive circuit to apply drive voltages to such respective wire bonding pads thus rendering each transistor element operative, which in turn enables successful driving of the vertical-cavity surface-emitting laser array 75.

Third Embodiment

In a third embodiment, an explanation will be given of one preferred embodiment of the case where the semiconductor device as manufactured by the same process as in the second embodiment stated supra is applied to a laser printer that is employed as image formation apparatus.

Figure 7:
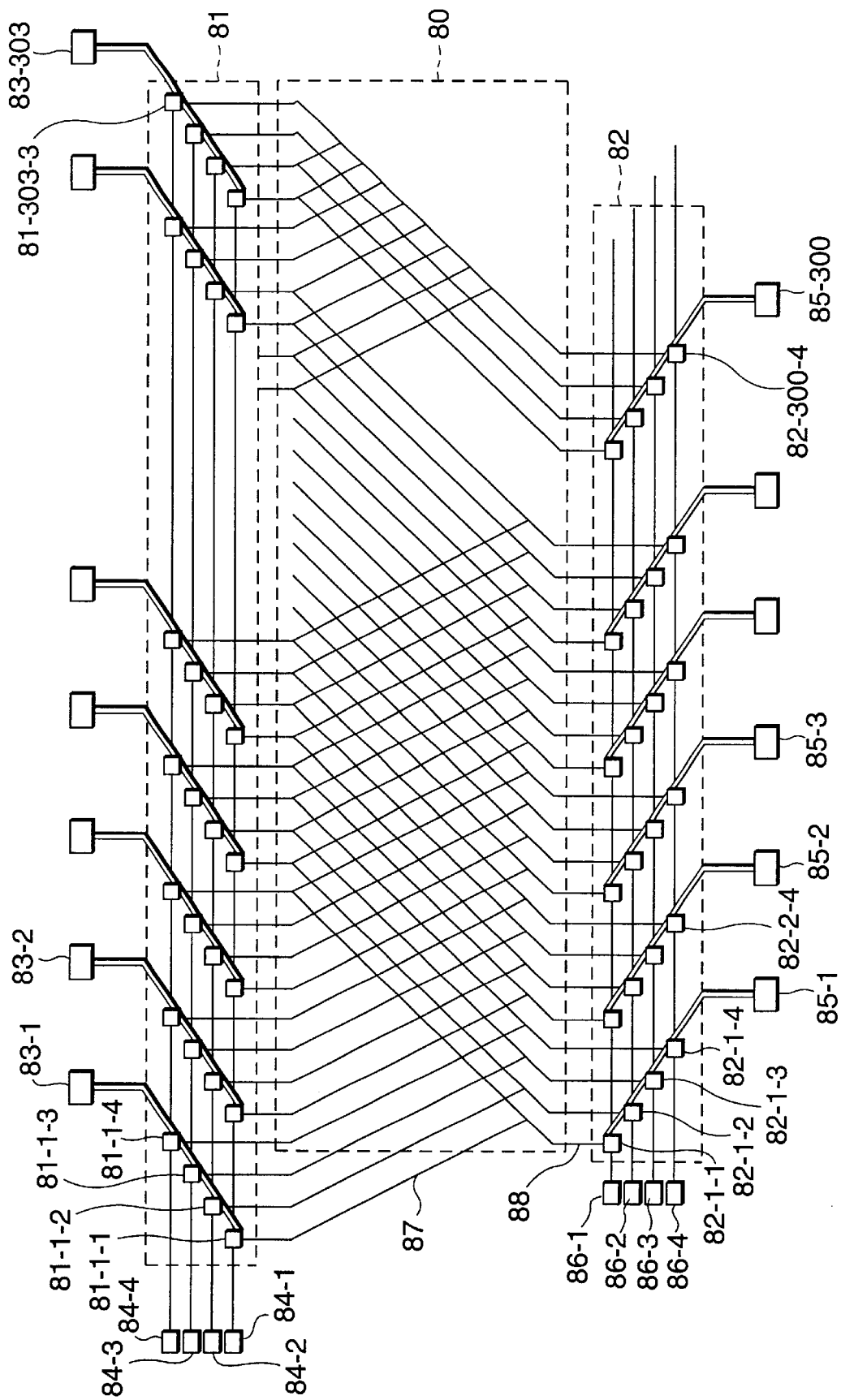
FIG. 7 is a schematical circuit diagram showing the layout and electrical lead connection of a light-emitting element array and transistor array in a semiconductor device in accordance with a third embodiment.
Figure 8:
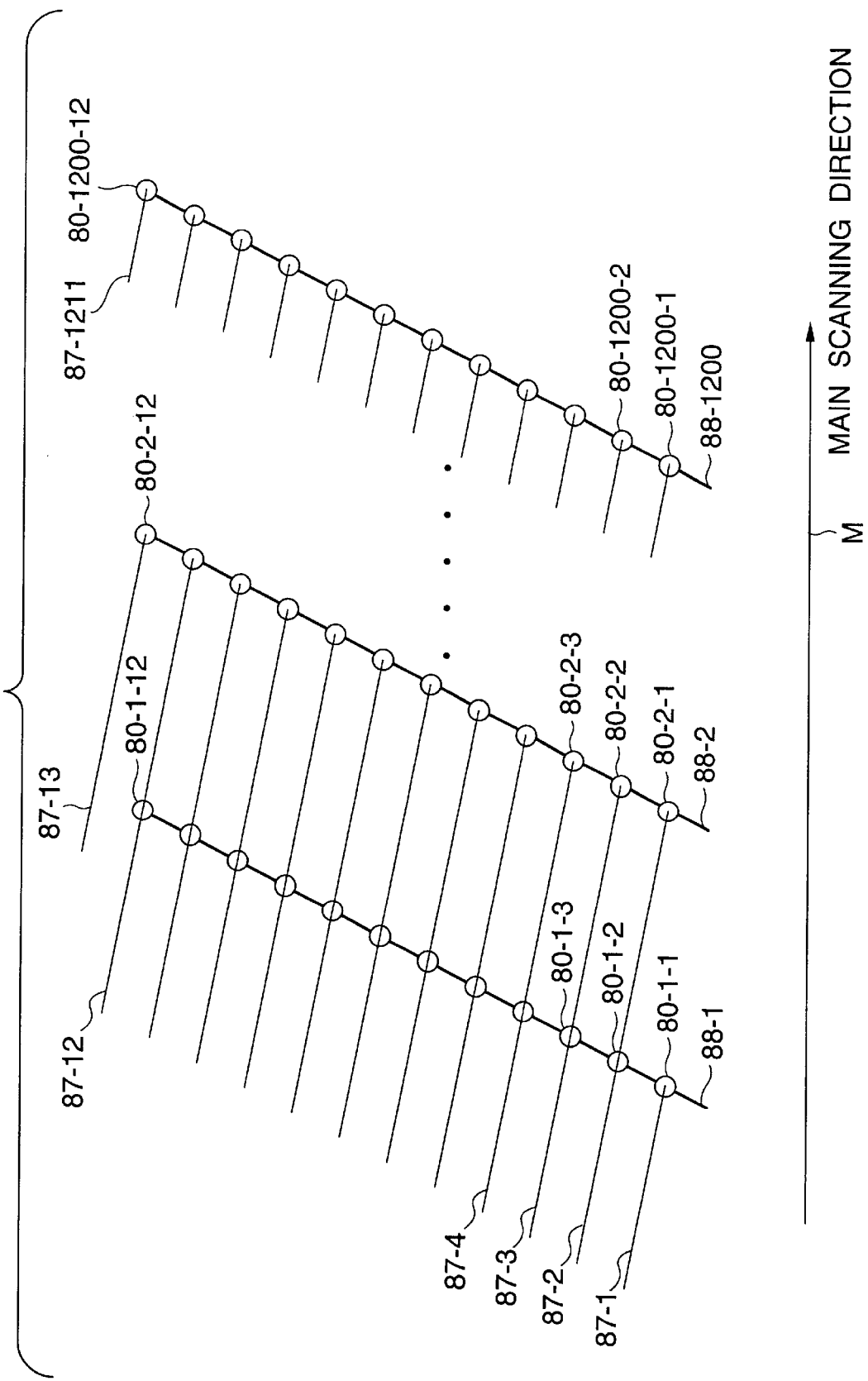
FIG. 8 is a diagram showing a detail of the layout and electrical lead connection of the light-emitting element array of shown in FIG. 7.

With an vertical-cavity surface-emitting laser array 80 in the third embodiment, vertical-cavity surface-emitting laser elements are laid out in a matrix of 12 rows and 1,200 columns while letting a pitch "a" in the row direction be a=21 μm and a pitch "b" in the column direction be b=21 μm (see FIG. 7; for a detail, see FIG. 8). Each column of the vertical-cavity surface-emitting laser array 80 is slanted or tilted diagonally to ensure that an array of projection points toward the column direction (the direction corresponding to the main scanning direction of laser printers) are aligned at equal intervals.

As shown in FIG. 7, a transistor array 81 is for driving anode leads 87 with respect to the vertical-cavity surface-emitting laser array 80 whereas a transistor array 82 is to drive cathode leads 88 for the vertical-cavity surface-emitting laser array 80.

The transistor array 81 in the third embodiment is arranged so that it consists of a matrix of four rows and 303 columns of transistor elements, whist the transistor array 82 includes a matrix of 4 rows and 300 columns of transistor elements. Wire bonding pads 83 that are formed at terminate ends of emitter leads for matrix-driving the transistor array 81 are laid out at the pitch of 84 μm; wire bonding pads 84 formed at the ends of base leads are at the pitch of 100 μm. In addition, wire bonding pads 85 that are formed at the ends of collector leads for matrix-driving the transistor array 82 are laid out at pitch of 84 μm whereas wire bonding pads 86 formed at ends of base leads are at pitch of 100 μm.

Note that the vertical-cavity surface-emitting laser array 80 corresponds to the light-emitting element array of the present invention; the transistor arrays 81 and 82 correspond to the switching element array of this invention; the wire bonding pads 83 and 85 to the first external connection ends of the invention; the wire bonding pads 84 and 86 to the second external connection ends of the invention.

An explanation will next be given of a configuration of a laser printer in case the semiconductor device 90 thus arranged is used as the light source thereof, in conjunction with FIG. 9.

As shown in this drawing, the semiconductor device 90 is operatively associated with a driver circuit 91 connected thereto. In the downstream of light 96 emitted from the semiconductor device 90, a lens system 92 and fold-back mirror 93 are sequentially disposed in this order. Further, a lens system 94 and photosensitive drum 95 are disposed sequentially in the traveling direction of light 96 as reflected off from the foldback mirror 93.

An overall operation of the laser printer thus arranged will next be explained. Note that the following explanation assumes that a picture image to be printed is made up of pixel data of 1,200 rows by 1,200 columns.

Firstly, the semiconductor device 90 is driven by the driver circuit 91 to emit a light beam that corresponds to the 12 rows and 1,200 columns of pixel data on the upper edge side of the image being printed. Whereby, the light 96 emitted from the semiconductor device 90 is guided to travel through the lens system 92 and foldback mirror 93 plus lens system 94 sequentially in this order to fall onto the surface of the photosensitive drum 95. Thus formed on the surface of photosensitive drum 95 is an image (latent image) which corresponds to the upper side portion of the to-be-printed image that consists of 12 rows and 1,200 columns of pixels. A driving procedure of the semiconductor device 90 using the driver circuit 91 will be described in detail later.

Figure 9:
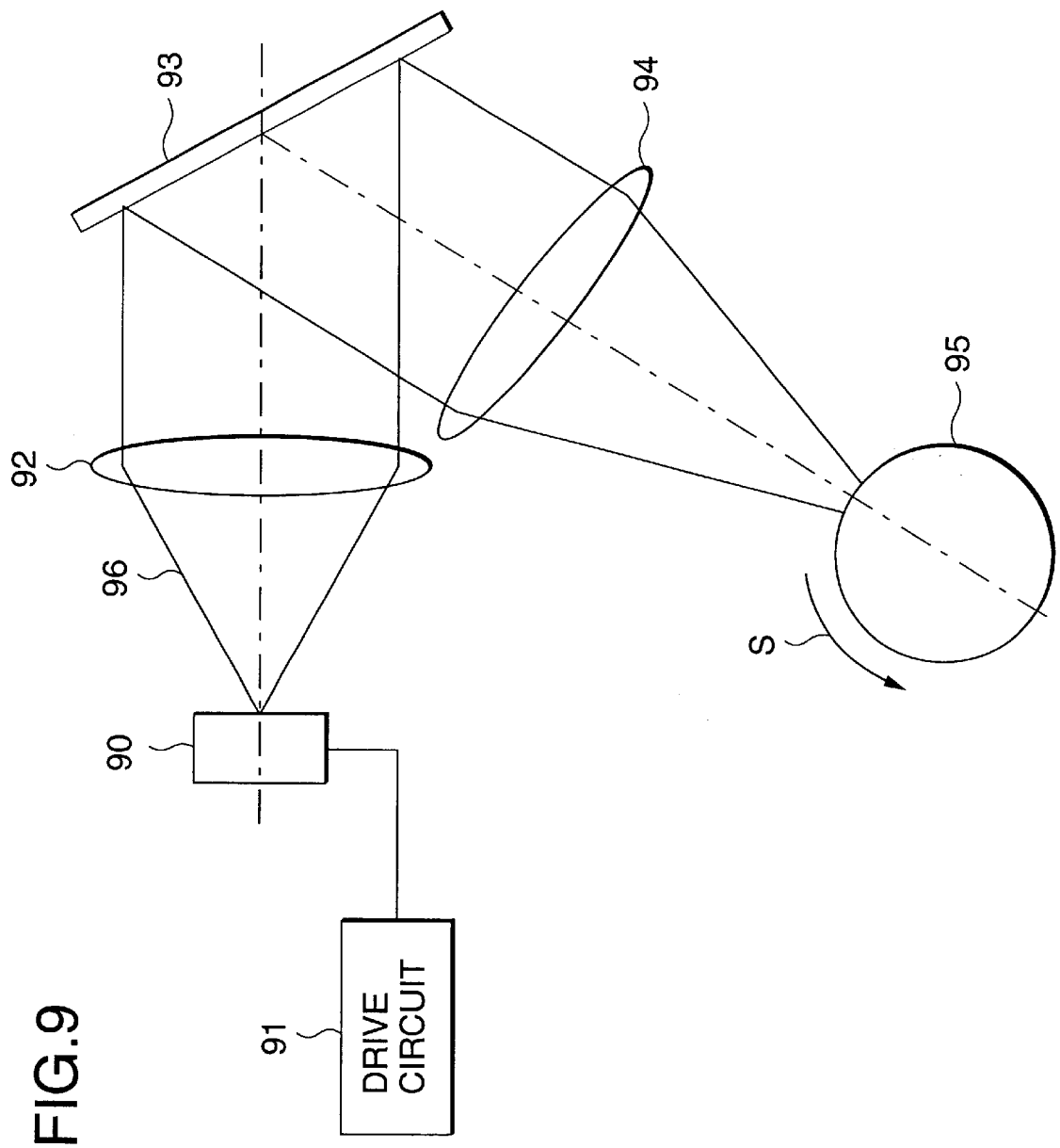
FIG. 9 is a diagram schematically showing a configuration of an image formation apparatus in accordance with the third embodiment.

Next, after having rotated the photosensitive drum 95 by an on-surface distance corresponding to twelve rows of the image in a direction indicated by arrow S in FIG. 9 (sub-scan direction), the semiconductor device 90 is driven by the driver circuit 91 to emit light that corresponds to those pixel data of twelve rows and 1,200 columns whose first row is at the thirteenth row from the uppermost edge of the image being printed. Whereby, an image (latent image) of the next pixel data of twelve rows and 1,200 columns whose first row is at the thirteenth row from the upper edge of the to-be-printed image is formed on the surface of the photosensitive drum 95.

The processes of forming an image (latent image) corresponding to twelve rows and 1,200 columns on the photosensitive drum 95 and of rotation-driving the photosensitive drum 95 toward the sub-scan direction will be recurrently performed a prespecified number of times (ten, in this embodiment) to thereby enable formation of the intended one-page image (latent image) on the surface of the photosensitive drum 95.

A drive procedure of the semiconductor device 90 due to the driver circuit 91 will next be explained with reference to FIG. 10. It should be noted that as shown in FIG. 7 and FIG. 8, anode leads 87 of the vertical-cavity surface-emitting laser array 80 are orderly adhered with reference numerals 87-1, 87-2, 87-3, . . . , 87-1211 as counted up from the left end of FIG. 8, whist cathode leads 88 of the vertical-cavity surface-emitting laser array 80 are numbered 88-1, 88-2, 88-3, . . . , 88-1200 from the left edge of FIG. 8. Similarly, vertical-cavity surface-emitting laser elements connected to the first column of cathode lead 88-1 are sequentially designated by 80-1-1, 80-1-2, 80-1-3, . . . , 80-1-12 from the bottom of FIG. 8; vertical-cavity surface-emitting laser elements connected to the second column cathode lead 88-2 are orderly denoted by 80-2-1, 80-2-2, 80-2-3, . . . , 80-2-12 from the bottom of FIG. 8; the remaining vertical-cavity surface-emitting laser elements are numbered in a similar way, and vertical-cavity surface-emitting laser elements connected to the 1,200th column of cathode lead 88-1200 are numbered 80-1200-1, 80-1200-2, 80-1200-3, . . . , 80-1200-12 in this order from the bottom of FIG. 8.

(1) First, drive certain ones of the cathode leads 88 each of which is selected from every group of twelve lines, such as the first lead 88-1, thirteenth lead 88-13, 25th lead 88-25, . . . , 1,189th one 88-1189. Driving the cathode leads 88 on such a "one-per-dozen" basis is to independently drive each vertical-cavity surface-emitting laser element. If this lead select interval were less than twelve then it will no longer be possible to attain such independent drive of each vertical-cavity surface-emitting laser element.

Figure 10:
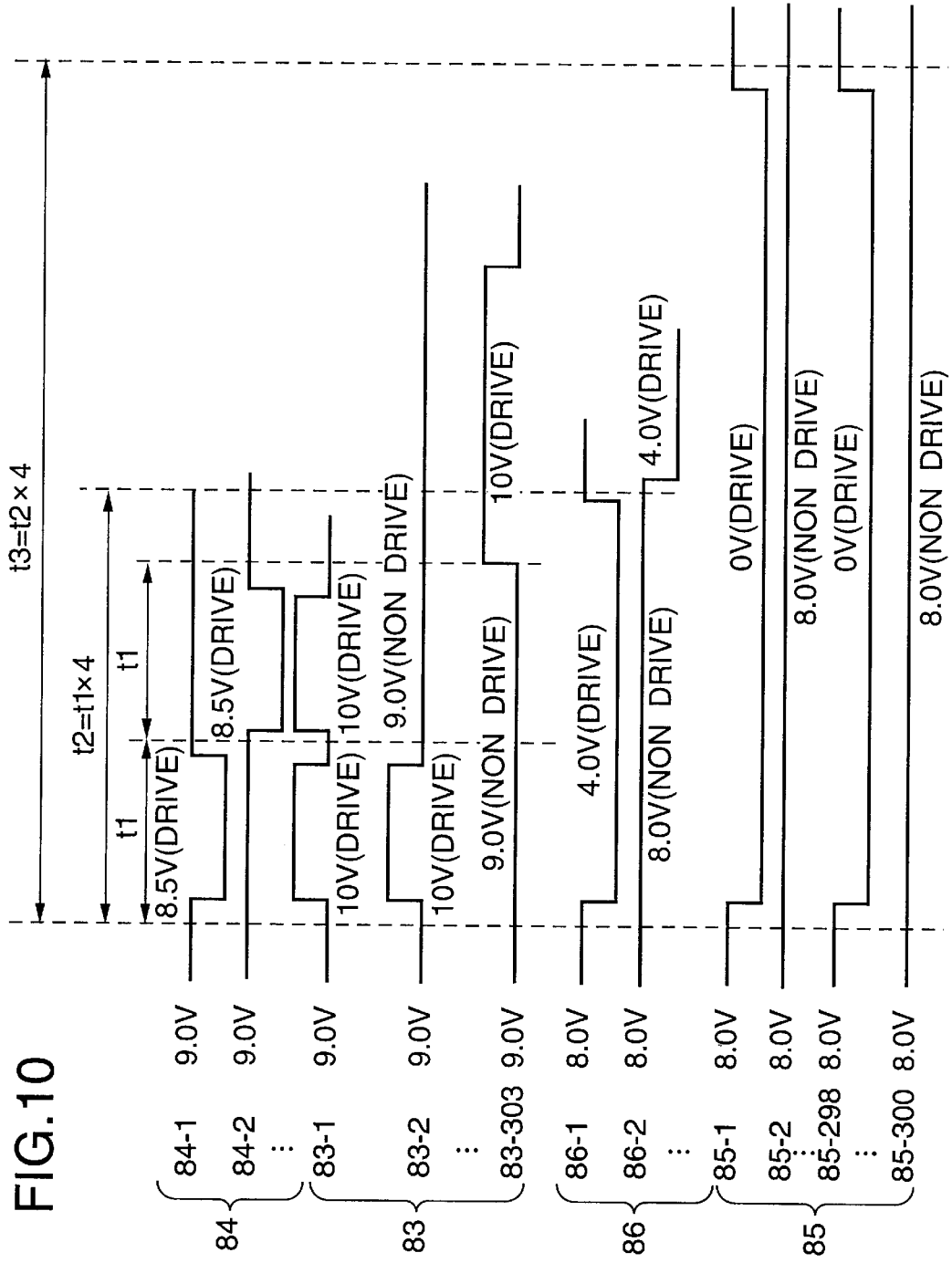
FIG. 10 is a timing chart for use in explaining an operation of the image formation apparatus in accordance with the third embodiment.
Figure 11:
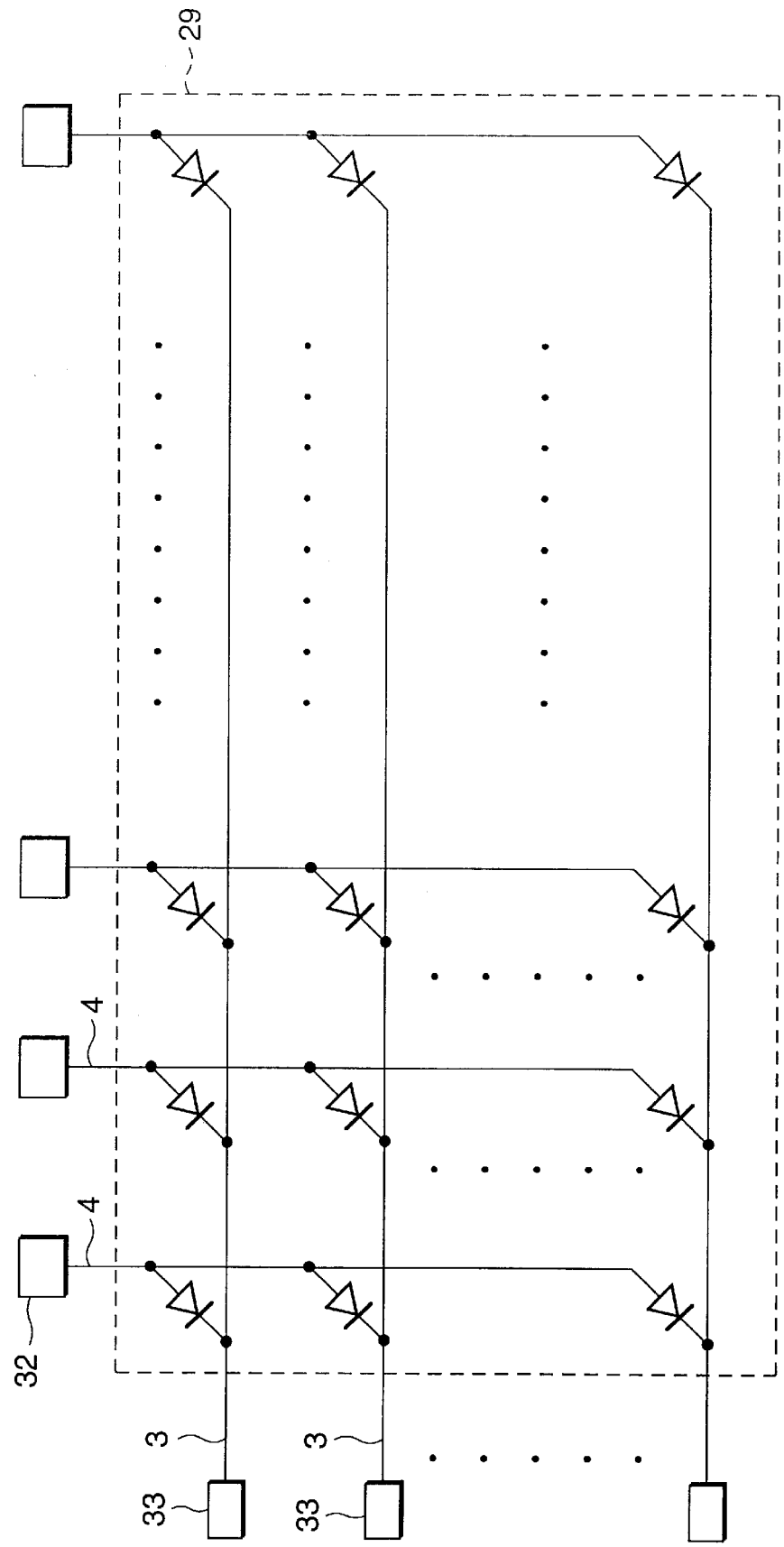
FIG. 11 is a schematical circuit diagram showing an example of the layout and electrical lead connection of one prior art light-emitting element array.

As shown in a timing diagram of FIG. 10, the driving method of each cathode lead 88 in this case includes the steps of letting a voltage potential on the base lead 86-1 (see FIG. 7) of the transistor array 82 that was set at 8.0V drop down at 4.0V (less than a pulse width t2), and lowering a voltage potential on the collector leads 85-1, 85-4, 85-7, . . . , 85-298 of the transistor array 82 that have been set at 8.0V down to 0V (less than a pulse width t3) to thereby drive those transistor elements 82-1-1, 82-4-1, 82-7-1, . . . , 82-298-1 at intersections thereof. All of the remaining base leads 86-2, 86-3 and 86-4 not being driven and the collector leads not being driven are set at a voltage potential of 8.0V. As shown in FIG. 10, the relation t3=t2×4 is established because four base leads 86-1, 86-2, 86-3, 86-4 are sequentially set in the ON state while the above-mentioned collector leads 85 are turned on. This results in only selected cathode leads 88-1, 88-13, . . . , 88-1189 are rendered conductive each of which is selected from every group of twelve successive cathode leads.

On the other hand, simultaneously during driving of these cathode leads 88, drive the anode leads 87 of certain vertical-cavity surface-emitting laser elements being selected for light emission. As shown in the timing chart of FIG. 10, a method of driving respective anode leads 87 is such that in order to first drive a desired one of the transistor elements connected to the first row of base lead 84-1, let the voltage potential of the base lead 84-1 which has been set at 9.0V drop down at 8.5V (pulse width is less than t1) while causing the potential of only one lead connected to the desired transistor element, which lead is selected from among the emitter leads 83-1, 83-2, 83-3, . . . , 83-303 that have been set at 9.0V, to rise up to 10V (pulse width is less than t1). This makes it possible to allow a current to flow only in a desired lead among the anode leads 87-1, 87-5, 87-9, . . . , 87-1209, thereby enabling emersion of light at desired ones as selected from among the first column of vertical-cavity surface-emitting laser elements 80-1-1, 80-1-5, 80-1-9, the thirteenth column of vertical-cavity surface-emitting laser elements 80-13-1, 80-13-5, 80-13-9, the 25th column of vertical-cavity surface-emitting laser elements 80-25-1, 80-25-5, 80-25-9, . . . , the 1,189th column of vertical-cavity surface-emitting laser elements 80-1189-1, 80-1189-5, 80-1189-9. At this time, the relation of t2=t1×4 is satisfied.

Next, after elapse of the time t1 as taken to drive the first row of base lead 84-1, in order to drive a desired transistor element connected to the second row of base lead 84-2, let the voltage potential of the base lead 84-2 drop from 9.0V to 8.5V (pulse width is less than t1) while causing the potential of a desired lead selected from the emitter leads 83-1, 83-2, 83-3, . . . , 83-303 to set at 10V. This makes it possible to allow a current to flow only in a desired lead among the anode leads 87-2, 87-6, 87-10, . . . , 87-1210, thereby enabling production of light at desired ones as selected from among the first column of vertical-cavity surface-emitting laser elements 80-1-2, 80-1-6, 80-1-10, the thirteenth column of vertical-cavity surface-emitting laser elements 80-13-2, 80-13-6, 80-13-10, the 25th column of vertical-cavity surface-emitting laser elements 80-25-2, 80-25-6, 80-25-10, . . . , the 1,189th column of vertical-cavity surface-emitting laser elements 80-1189-2, 80-1189-6, 80-1189-10.

Further, in a similar way, let the third row of base lead 84-3 potentially drop from 9.0V down at 8.5V (pulse width is less than t1) while causing a desired lead of the emitter leads 83-1, 83-2, 83-3, . . . , 83-303 to increase in potential up to 10V to thereby permit current flow in desired anode leads 87-3, 87-7, 87-11, . . . , 87-1211 thus enabling light emission at vertical-cavity surface-emitting laser elements concerned. Further, similarly, in order to drive those transistor elements connected to the fourth row of base lead 84-4, let a desired lead of the emitter leads 83-1, 83-2, 83-3, . . . , 83-303 increase in potential up to 10V to thereby permit application of a pulse voltage to desired anode leads 87-4, 87-8, 87-12, . . . , 87-1208 thus enabling light emersion at such vertical-cavity surface-emitting laser elements.

In the way stated above, it is possible to offer drivability covering all of the anode leads 87 of vertical-cavity surface-emitting laser elements.

(2) Next, in order to advance one by one the column of the vertical-cavity surface-emitting laser elements being driven, drive the base lead 86-2 of the transistor array 82 for driving the cathode leads 88 (pulse width is less than t2), and drive the anode leads 87 in the same way as that in the previous case (1). Whereby, only selected transistor elements 82-1-2, 82-4-2, . . . , 82-298-2—each is picked up from every groups of twelve successive ones—are driven while a voltage is applied to cathode leads 88-2, 88-14, . . . , 88-1190 each of which is per group of twelve ones so that all the anode leads 87 are driven. Further, the remaining base leads 86-3, 86-4 are driven in a similar way; the abode leads 87 are driven in the same way as in the case (1). Whereby, the column of cathode leads 88 being driven advances four lines.

Thereafter, in a similar way, in order to sequentially advance the column of cathode leads 88 being driven, select the to-be-driven base leads 86-1, 86-2, 86-3, 86-4 and collector leads 85-1, 85-2, . . . , 85-300 to thereby drive transistor elements residing at intersections thereof. By driving all of the columns of cathode leads 88 of the vertical-cavity surface-emitting laser array 80 in the procedure stated above, it becomes possible to sequentially activate for light emission all of the vertical-cavity surface-emitting laser elements constituting the vertical-cavity surface-emitting laser array 80.

(3) Recurrently executing the driving sequence makes it possible to let the vertical-cavity surface-emitting laser array 80 emit light continuously without interruptions, which in turn enables it to be used as the light source of the laser printer.

As has been explained in detail above, in the semiconductor device in accordance with each of the embodiments above, since the device is arranged so that the transistor array for use in driving the vertical-cavity surface-emitting laser array is monolithically formed on the substrate of the vertical-cavity surface-emitting laser array while at the same time providing the transistor array with wire bonding pads for connection with external driver circuitry, the following advantages are obtainable.

As it is possible to enlarge or "expand" the layout pitch of the electrical connection means such as wire-bonding pads or the like, the lead pitch of such vertical-cavity surface-emitting laser array can be narrowed without being limited by the layout pitch of the wire bonding used.

The layout pitch of vertical-cavity surface-emitting laser array can be narrowed without being limited by the layout pitch of the wire bonding.

The ball size of wire bonding can be enlarged thus enabling the bonding adhesion strength to increase accordingly.

The ball size of wire bonding can be enlarged enabling the bonding success rate to likewise increase.

A problem such as wire contacting or else will hardly take place since the distance between adjacent wires can be widened.

In addition, as the transistor array is disposed immediately adjacent to the vertical-cavity surface-emitting laser array, it becomes possible to drive the vertical-cavity surface-emitting laser array at high frequencies.

it is possible to inject into the vertical-cavity surface-emitting laser array a current waveform high in rectangularity.

the current value required for driving the vertical-cavity surface-emitting laser array can be reduced thus enabling facilitation of the design of such driver circuitry.

It must be noted that although in the third embodiment an explanation was given of the case where the semiconductor device of the present invention is utilized as the light source of image formation apparatus having a photosensitive drum, the present invention should not exclusively be limited thereto and, needless to say, the device may alternatively be used as the light source of moving-picture image formation apparatus including but not limited to laser display units.

Also note that although in the second and third embodiments an explanation was given of the case where the transistor array is formed overlying the laser structure layer, the present invention should not be limited only to this, and may also be in the form in which the transistor array is fabricated underlying the laser structure layer; still alternatively, another form may be employed in which the region of the vertical-cavity surface-emitting laser array is limited by selective growth utilizing a $SiO_2$ film or the like for removal of the $SiO_2$ film or the like to thereby form the transistor array on a lateral side of the laser structure layer.

Additionally, although in the second and third embodiments an explanation was given of the case where the transistor structure was an AlGaAs/GaAs hetero-bipolar transistor structure, the instant invention should not be exclusively limited thereto and, needless to say, a GaAs homo-junction bipolar transistor may be used in place thereof.

Furthermore, although in a respective one of the above embodiments an explanation was given of the case where the light-emitting elements are comprised of vertical-cavity surface-emitting laser elements, this invention should not be limited only to this arrangement and may alternatively be in the form that employs edge-emitting or cleaved-plane light emission laser elements.

In accordance with the semiconductor devices as set forth in claims 1 to 5, since a switching element array that has switching elements laid out in a matrix form for controlling driving of respective light-emitting elements included in a light-emitting element array is provided with external connection ends used for external connection, it becomes possible to narrow the layout pitch of the light-emitting element array, which in turn makes it possible to form the light-emitting element array with increased integration density.

In addition, according to the image formation apparatus set forth in claim 6, because this apparatus employs as its light source the semiconductor device with the highly integrated light-emitting element array recited in claims 1 to 5, an effect is obtained of enabling formation of high-density images while reducing complexity.

What is claimed is:

1. A semiconductor device, comprising:
   a light-emitting element away including a plurality of light-emitting elements arranged in matrix form and being formed on a semiconductor substrate;
   a switching element array formed on said semiconductor substrate monolthically with said light-emitting element array, and including switching elements laid out in a matrix form and each having an input end, an output end and a control end with one of said input end and said output end of each switching element being connected to any one of said plurality of light-emitting elements arranged in matrix form;
   first connection means for connecting the control end of each of the plurality of switching elements disposed in the same column, or the other of the input end and the output end thereof, to a first external connection end that is different per said same column; and
   second connection means for connecting the control end of each of the plurality of switching elements disposed in the same column, or one side of the other of the input end and the output end thereof, said connection not being connected to said first external connection end, and instead being connected to a second external connection end different per said same row.

2. The semiconductor device as recited in claim 1, wherein the plurality of light-emitting elements included in said light-emitting element array are laid out in a matrix form and connected by matrix leads, and wherein either a row lead or a column lead of said matrix leads is connected to one of the input ends and output ends of said switching elements.

3. The semiconductor device as recited in claim 2, wherein said light-emitting elements are vertical-cavity surface-emitting laser elements.

4. The semiconductor device as recited in claim 2, wherein a multilayer structure of said switching element array on said semiconductor substrate is formed in a direction perpendicular to a multilayer plane of the multilayer structure of said light-emitting element array.

5. The semiconductor device as recited in claim 2, wherein a multilayer structure of said switching element array on said semiconductor substrate is formed in a direction parallel to a multilayer plane of the multilayer structure of said light-emitting element array.

6. The semiconductor device as recited in claim 1, wherein said light-emitting elements are vertical-cavity surface-emitting laser elements.

7. The semiconductor device as recited in claim 6, wherein a multilayer structure of said switching element array on said semiconductor substrate is formed in a direction perpendicular to a multilayer plane of the multilayer structure of said light-emitting element array.

8. The semiconductor device as recited in claim 6, wherein a multilayer structure of said switching element array on said semiconductor substrate is formed in a direction parallel to a multilayer plane of the multilayer structure of said light-emitting element array.

9. The semiconductor device as recited in claim 1, wherein a multilayer structure of said switching element array on said semiconductor substrate is formed in a direction perpendicular to a multilayer plane of the multilayer structure of said light-emitting element array.

10. The semiconductor device as recited in claim 1, wherein a multilayer structure of said switching element array on said semiconductor substrate is formed in a direction parallel to a multilayer plane of the multilayer structure of said light-emitting element array.

11. An image forming apparatus, comprising:
    a semiconductor device that is driven to emit a light beam, said semiconductor device including:
    a light-emitting element array including a plurality of light-emitting elements arranged in matrix form and being formed on a semiconductor substrate;
    a switching element array formed on said semiconductor substrate monolithically with said light-emitting element array, and including switching elements laid out in a matrix form and each having an input end, an output end and a control end with one of said plurality end and said output end of each switching element being connected to any one of said plurality of light-emitting elements arranged in matrix form;
    first connection means for connecting the control end of each of the plurality of switching elements disposed in the same column, or the other of the input end and the output end thereof, to a first external connection end that is different per said same column; and
    second connection means for connecting the control end of each of the plurality of switching elements disposed in the same column, or one side of the other of the input end and the output end thereof, said connection not being connected to said first external connection end, and instead being connected to a second external connection end different per said same row.

12. An image formation apparatus, comprising:
    a semiconductor device that is driven to emit a light beam, said semiconductor device including:
    a light-emitting element array including a plurality of light-emitting elements arranged in matrix form and being formed on a semiconductor substrate;
    a switching element array formed on said semiconductor substrate monolithically with said light-emitting element array, and including switching elements laid out in a matrix form and each having an input end, an output end and a control end with one of said input end and said output end of each switching element being connected to any one of said plurality of light-emitting elements arranged in matrix form;
    first connection means for connecting the control end of each of the plurality of switching elements disposed in the same column, or the other of the input end and the output end thereof, to a first external connection end that is different per said same column; and
    second connection means for connecting the control end of each of the plurality of switching elements disposed in the same column, or one side of the other of the input end and the output end thereof, said connection not being connected to said first external connection end, and instead being connected to a second external connection end different per said same row:

wherein:
    the plurality of light-emitting elements included in said light-omitting element array are laid out in a matrix form and connected by matrix leads; and
    either a row lead or a column lead of said matrix lead is connected to one of the input ends and output ends of said switching elements.

13. An image formation apparatus, comprising:
a semiconductor device that is driven to emit a light beam, said semiconductor device including:
    a light-emitting element array including a plurality of light-emitting elements arranged in matrix form and being formed on a semiconductor substrate;
    a switching element array formed on said semiconductor substrate monolithically with said light-emitting element array, and including switching elements laid out in a matrix form and each having an input end, an output end and a control end with one of said input end and said output end of each switching element being connected to any one of said plurality of light-emitting elements arranged in matrix form;
    first connection means for connecting the control end of each of the plurality of switching elements disposed in the same column, or the other of the input end and the output end thereof, to a first external connection end that is different per said same column; and
    second connection means for connecting the control end of each of the plurality of switching elements disposed in the same column, or one side of the other of the input end and the output end thereof, said connection not being connected to said first external connection end, and instead being connected to a second external connection end different per said same row:
    wherein:
        the light-emitting elements are vertical-cavity surface-emitting laser elements.

14. An image formation apparatus, comprising:
a semiconductor device that is driven to emit a light beam, said semiconductor device including:
    a light-emitting element array including a plurality of light-emitting elements arranged in matrix form and being formed on a semiconductor substrate;
    a switching element array formed on said semiconductor substrate monolithically with said light-emitting element array, and including switching elements laid out in a matrix form and each having an input end, an output end and a control end with one of said input end and said output end of each switching element being connected to any one of said plurality of light-emitting elements arranged in matrix form;
    first connection means for connecting the control end of each of the plurality of switching elements disposed in the same column, or the other of the input end and the output end thereof, to a first external connection end that is different per said same column; and
    second connection means for connecting the control end of each of the plurality of switching elements disposed in the same column, or one side of the other of the input end and the output end thereof, said connection not being connected to said first external connection end, and instead being connected to a second external connection end different per said same row:
    wherein:
        a multilayer structure of said switching element array on said semiconductor substrate is formed in a direction perpendicular to a multilayer plane of the multilayer structure of said light-emitting element array.

15. An image formation apparatus, comprising:
a semiconductor device that is driven to emit a light beam, said semiconductor device including:
    a light-emitting element array including a plurality of light-emitting elements arranged in matrix form and being formed on a semiconductor substrate;
    a switching element array formed on said semiconductor substrate monolithically with said light-emitting element array, and including switching elements laid out in a matrix form and each having an input end, an output end and a control end with one of said input end and said output end of each switching element being connected to any one of said plurality of light-emitting elements arranged in matrix form;
    first connection means for connecting the control end of each of the plurality of switching elements disposed in the same column, or the other of the input end and the output end thereof, to a first external connection end that is different per said same column; and
    second connection means for connecting the control end of each of the plurality of switching elements disposed in the same column, or one side of the other of the input end and the output end thereof, said connection not being connected to said first external connection end, and instead being connected to a second external connection end different per said same row:
    wherein: p4 a multilayer structure of said switching element array on said semiconductor substrate is formed in a direction parallel to a multilayer plane of the multilayer structure of said light-emitting element array.

* * * * *